United States Patent
Kawabe

(10) Patent No.: US 12,452,998 B2
(45) Date of Patent: Oct. 21, 2025

(54) MULTILAYER SUBSTRATE

(71) Applicant: Murata Manufacturing Co., Ltd., Nagaokakyo (JP)

(72) Inventor: Kentarou Kawabe, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 262 days.

(21) Appl. No.: 18/360,831

(22) Filed: Jul. 28, 2023

(65) Prior Publication Data

US 2024/0074038 A1 Feb. 29, 2024

(30) Foreign Application Priority Data

Aug. 23, 2022 (JP) ................. 2022-132684
Apr. 21, 2023 (JP) ................. 2023-069904

(51) Int. Cl.
| | |
|---|---|
| H05K 1/02 | (2006.01) |
| H01P 1/203 | (2006.01) |
| H01Q 21/06 | (2006.01) |
| H03H 1/00 | (2006.01) |
| H01P 3/08 | (2006.01) |
| H05K 1/03 | (2006.01) |

(52) U.S. Cl.
CPC ....... H05K 1/0251 (2013.01); H01P 1/20345 (2013.01); H01Q 21/065 (2013.01); *H01P 3/081* (2013.01); *H03H 2001/0085* (2013.01); *H05K 1/032* (2013.01); *H05K 1/0346* (2013.01); *H05K 2201/0129* (2013.01); *H05K 2201/0141* (2013.01); *H05K 2201/0154* (2013.01); *H05K 2201/09727* (2013.01)

(58) Field of Classification Search
CPC ............... H01K 1/0251; H01K 1/112; H03H 2001/0085; H03H 7/0115; H01P 1/20345; H01Q 21/065
USPC ................................................. 333/175, 185
See application file for complete search history.

(56) References Cited

U.S. PATENT DOCUMENTS

| | | | |
|---|---|---|---|
| 11,228,118 B2 * | 1/2022 | Kang | ................. H01Q 21/0025 |
| 2020/0194893 A1 | 6/2020 | Im | |

* cited by examiner

*Primary Examiner* — Rakesh B Patel
(74) *Attorney, Agent, or Firm* — XSENSUS LLP

(57) ABSTRACT

A maximum width of a second connection portion in a line width direction is smaller than a maximum width of a first connection portion in the line width direction. A first intermediate portion includes a first thick-line portion of which the width is greater than that of a transmission line portion in the line width direction. A second intermediate portion includes a second thick-line portion of which the width is greater than that of a transmission line portion in the line width direction. The first thick-line portion and the second thick-line portion adjoin the transmission line portion.

20 Claims, 12 Drawing Sheets

Fig.3
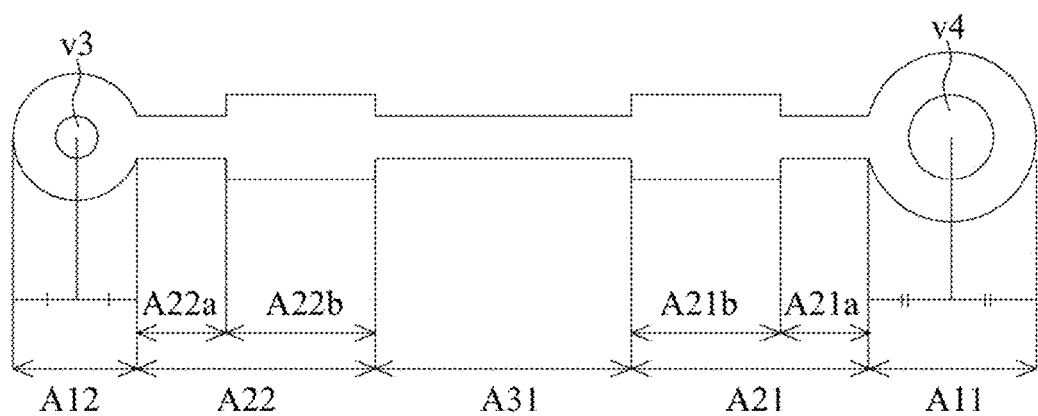
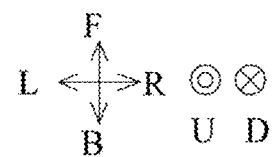

Fig.5
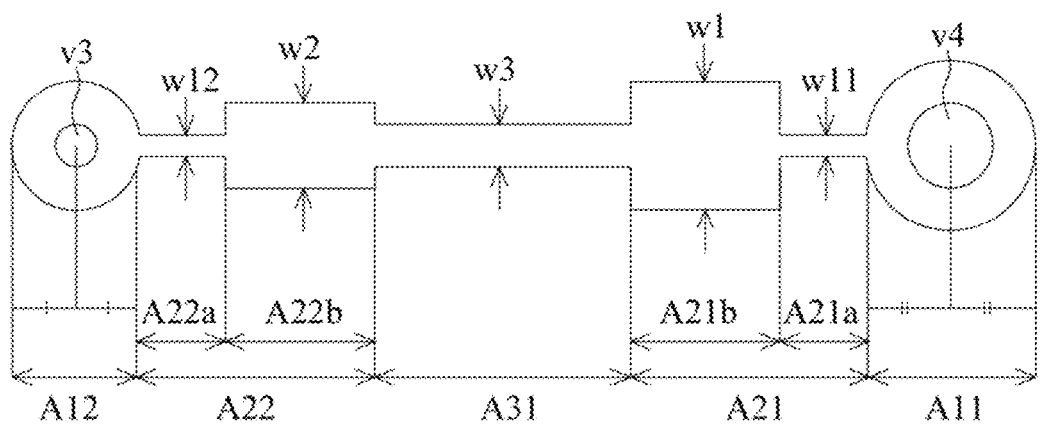
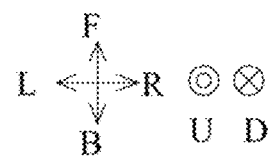

Fig.6
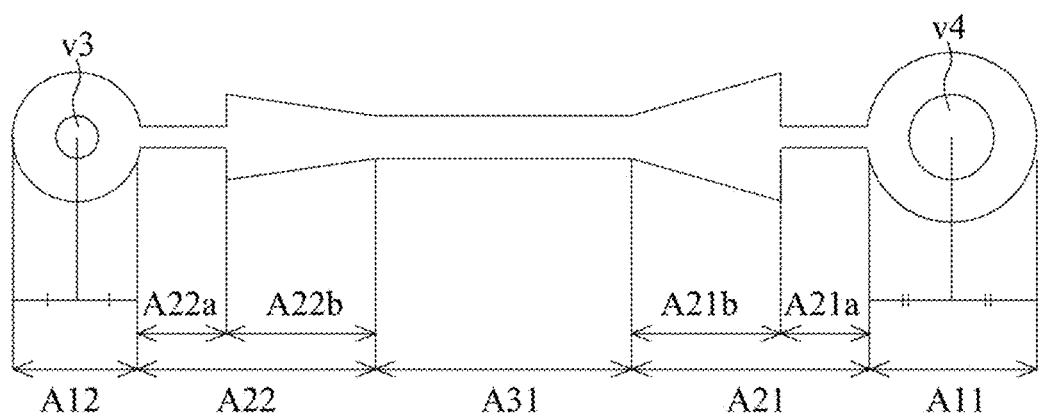
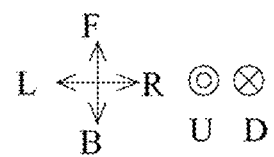

Fig.7
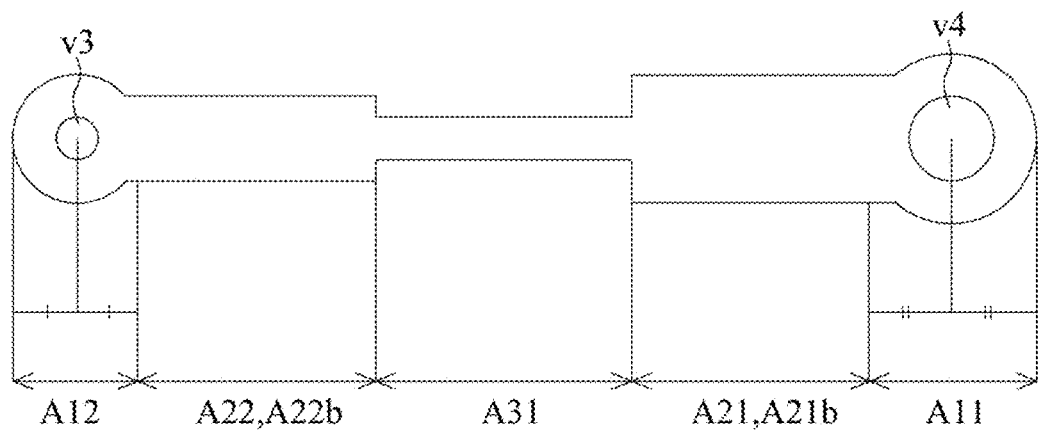
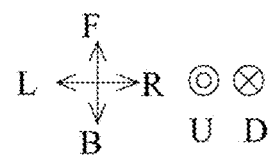

Fig.9
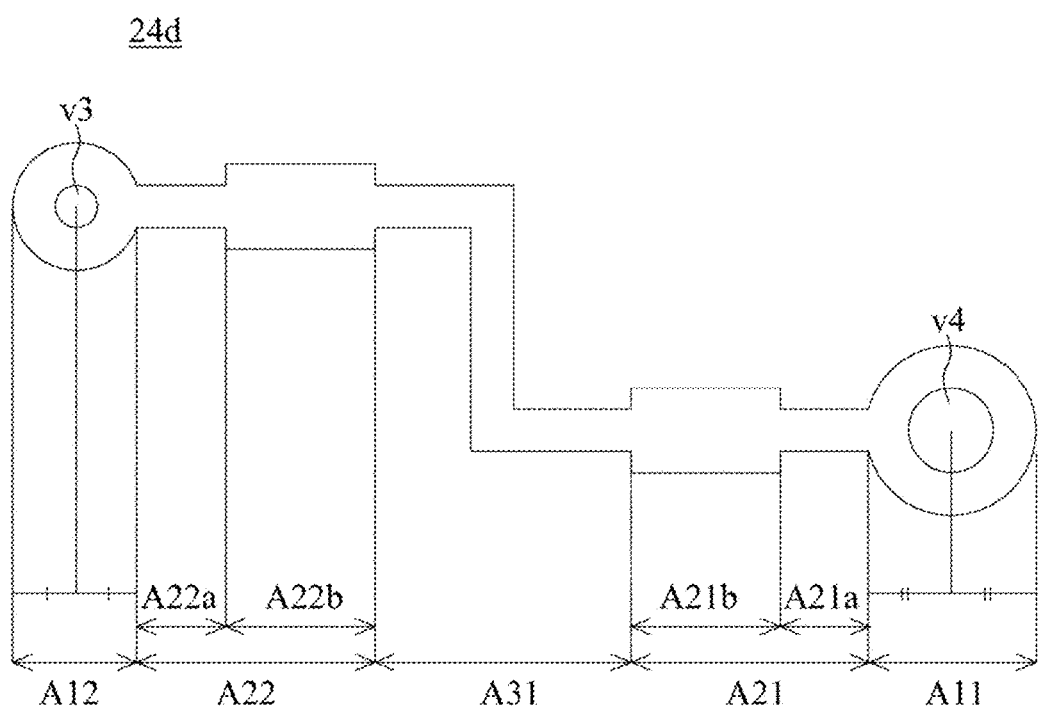
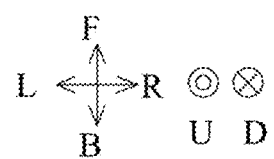

Fig.12
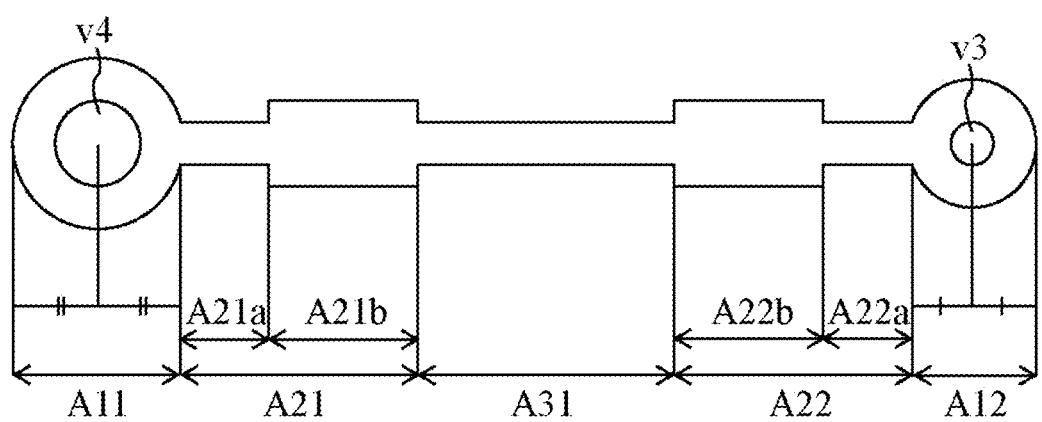
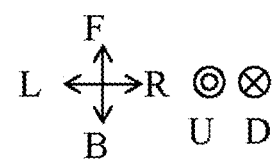

MULTILAYER SUBSTRATE

CROSS-REFERENCE TO RELATED APPLICATIONS

This application claims priority to Japanese Patent Application No. JP 2022-132684, filed on Aug. 23, 2022, and Japanese Patent Application No. JP 2023-069904, filed on Apr. 21, 2023. The entire contents of the above-identified applications, including the specifications, drawings and claims, are incorporated herein by reference in their entirety.

BACKGROUND OF THE DISCLOSURE

1. Field of the Disclosure

The present disclosure relates to a multilayer substrate including a radiation conductor layer.

2. Description of the Related Art

An antenna module described in U.S. Patent Application Publication No. 2020/0194893 is a known disclosure related to a multilayer substrate. The antenna module includes an antenna package and a connection member. The connection member is a belt-like substrate having flexibility. The connection member includes a feed line. The antenna package is fixed to the connection member. The antenna package includes a patch antenna. The patch antenna is electrically connected to the feed line.

SUMMARY OF THE DISCLOSURE

In the antenna module described in U.S. Patent Application Publication No. 2020/0194893, a mismatch in characteristic impedance between the patch antenna and the feed line may occur.

Accordingly, it is an object of the present disclosure to provide a multilayer substrate that can reduce the occurrence of the mismatch in characteristic impedance between a signal conductor layer and a radiation conductor layer.

According to an embodiment of the present disclosure, a multilayer substrate includes i) a multilayer body in which multiple insulator layers including an intermediate insulator layer and a negative-side adjoining insulator layer are laminated in a Z-axis direction, each one of the insulator layers having a positive-side principal surface and a negative-side principal surface positioned closer to a negative side of Z-axis than the positive-side principal surface, the negative-side adjoining insulator layer being positioned closer to the negative side of Z-axis than the intermediate insulator layer and adjoining the intermediate insulator layer; ii) a radiation conductor layer disposed in the multilayer body at a position closer to a positive side of Z-axis than the intermediate insulator layer; iii) a signal conductor layer disposed in the multilayer body at a position closer to the negative side of Z-axis than the intermediate insulator layer; iv) a connection conductor layer disposed on the negative-side principal surface of the intermediate insulator layer in the multilayer body, the connection conductor layer including a first connection portion, a second connection portion, a transmission line portion, a first intermediate portion, and a second intermediate portion, the first intermediate portion adjoining the first connection portion, the second intermediate portion adjoining the second connection portion, the transmission line portion adjoining the first intermediate portion and the second intermediate portion; v) a first ground conductor layer disposed in the multilayer body at a position closer to the negative side of Z-axis than the connection conductor layer and the signal conductor layer, the first ground conductor layer overlapping the connection conductor layer at least partially and also overlapping the signal conductor layer at least partially as viewed in the Z-axis direction; vi) a first inter-layer connection conductor being in contact with the first connection portion; and vii) a second inter-layer connection conductor being in contact with the second connection portion. One of the first inter-layer connection conductor and the second inter-layer connection conductor pierces through the intermediate insulator layer in the Z-axis direction and electrically connects the connection conductor layer and the radiation conductor layer to each other. The other one of the first inter-layer connection conductor and the second inter-layer connection conductor pierces through the negative-side adjoining insulator layer in the Z-axis direction and electrically connect the connection conductor layer and the signal conductor layer to each other. A longitudinal direction of the connection conductor layer is defined as a direction in which the connection conductor layer is elongated, and a line width direction of the connection conductor layer is defined as a direction orthogonally intersecting both the longitudinal direction and the Z-axis direction. The first connection portion is positioned at a first end portion of the connection conductor layer in the longitudinal direction, and the second connection portion is positioned at a second end portion of the connection conductor layer in the longitudinal direction. The first end portion and the second end portion of the connection conductor layer are positioned opposite to each other in the longitudinal direction. In the longitudinal direction, opposite ends of the first connection portion are positioned equidistantly from a center of the first inter-layer connection conductor as viewed in the Z-axis direction. In the longitudinal direction, opposite ends of the second connection portion are positioned equidistantly from a center of the second inter-layer connection conductor as viewed in the Z-axis direction. In the line width direction, a maximum width of the second connection portion is smaller than a maximum width of the first connection portion. The first intermediate portion includes a first thick-line portion of which a width is greater than that of the transmission line portion in the line width direction. The second intermediate portion includes a second thick-line portion of which a width is greater than that of the transmission line portion in the line width direction. The first thick-line portion and the second thick-line portion adjoin the transmission line portion.

Advantageous Effects of Disclosure

According to the present disclosure, the multilayer substrate can reduce the occurrence of the mismatch in characteristic impedance between the signal conductor layer and the radiation conductor layer.

BRIEF DESCRIPTION OF THE DRAWINGS

FIG. 3 is a top view illustrating a connection conductor layer 24.

FIG. 5 is a top view illustrating a connection conductor layer 24*a*.

FIG. 6 is a top view illustrating a connection conductor layer 24b.

FIG. 7 is a top view illustrating a connection conductor layer 24c.

FIG. 9 is a top view illustrating a connection conductor layer 24d.

FIG. 10 is a cross-sectional view illustrating a multilayer substrate 10a.

FIG. 12 is a top view illustrating the connection conductor layer 24 disposed in the multilayer substrate 10b.

DESCRIPTION OF THE PREFERRED EMBODIMENTS

First Embodiment

Structure of Multilayer Substrate 10

Figure 1:
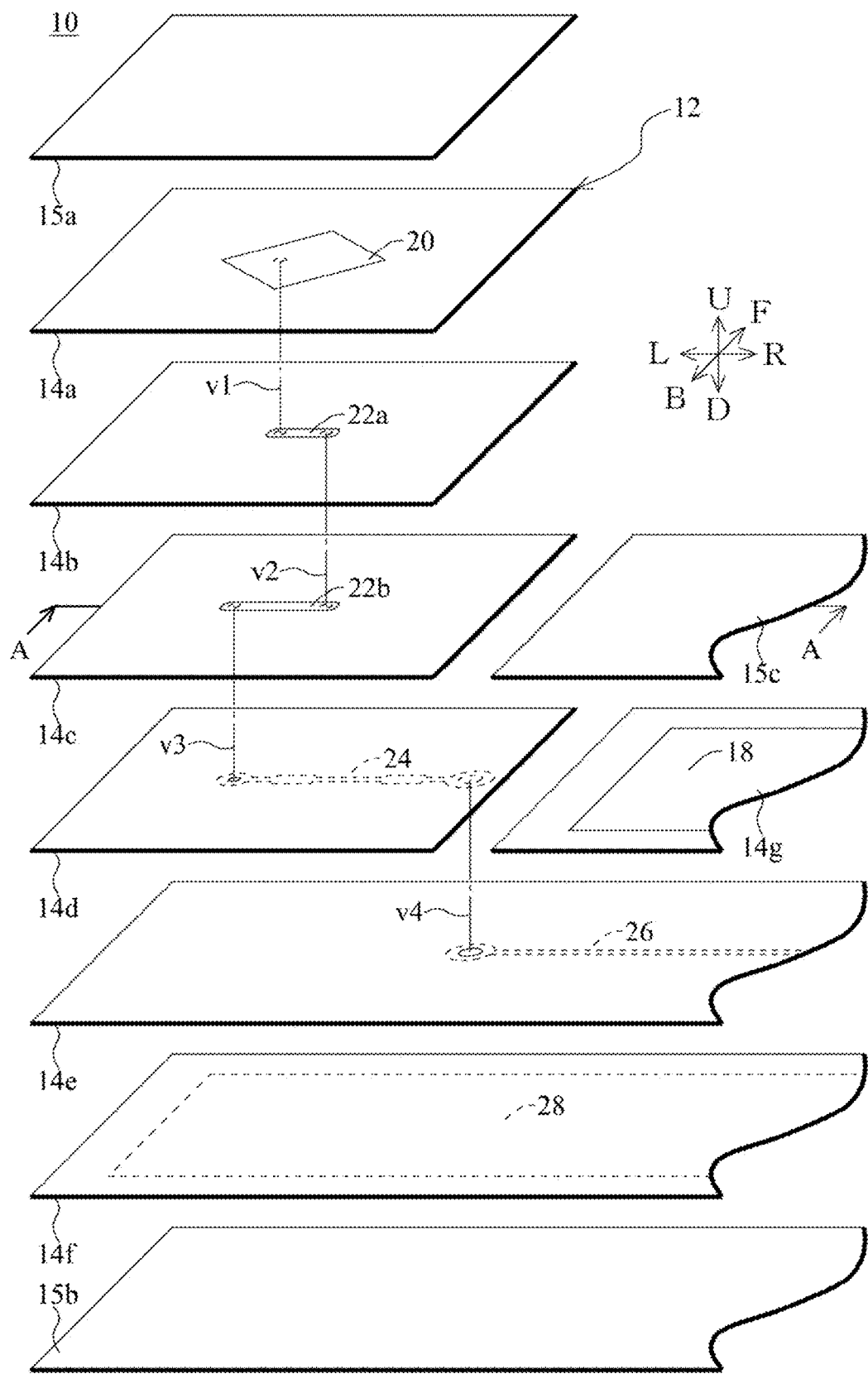
FIG. 1 is an exploded perspective view illustrating a multilayer substrate 10.
Figure 2:
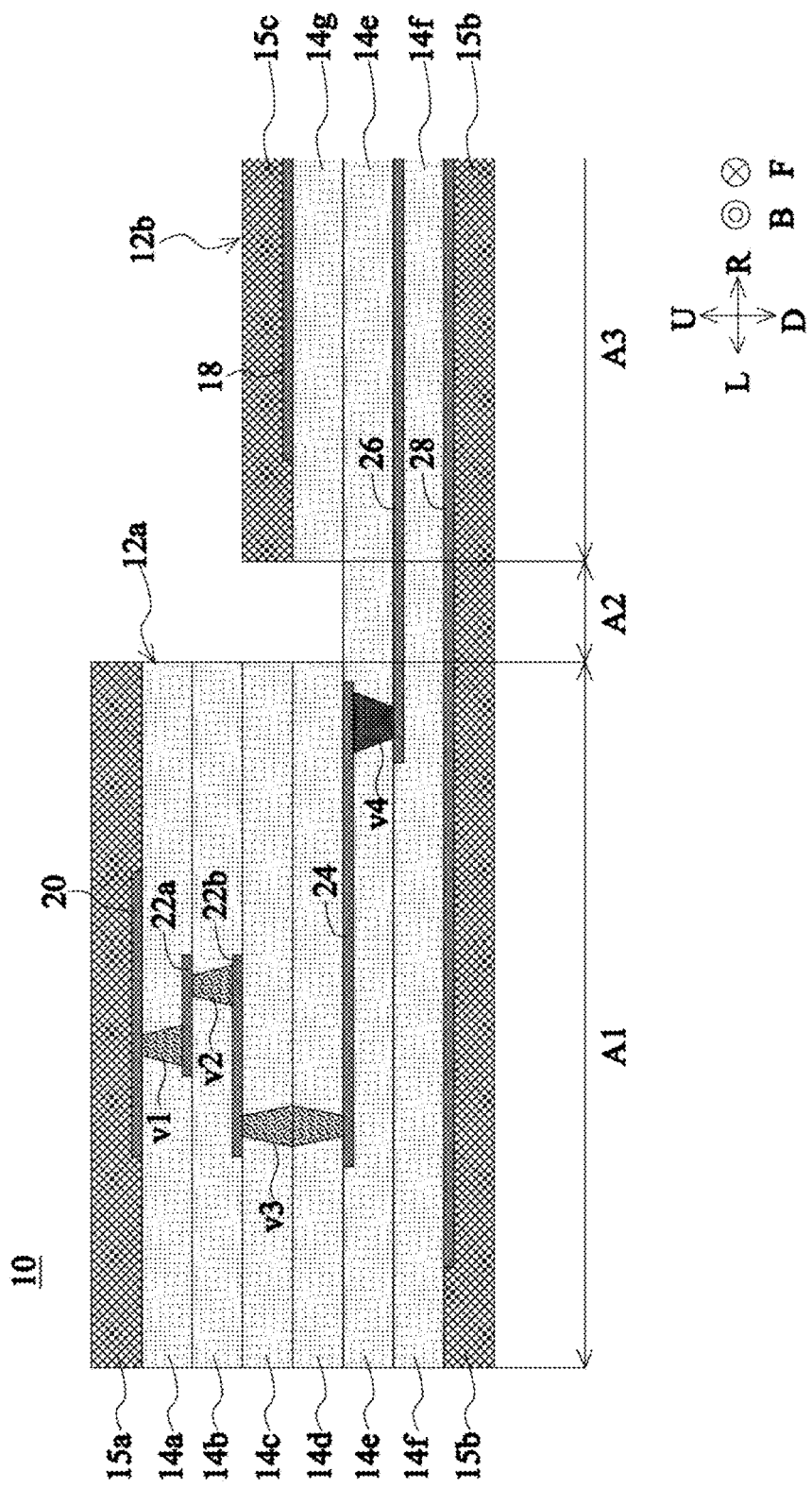
FIG. 2 is a cross-sectional view illustrating the multilayer substrate 10 taken along line A-A in FIG. 1.

A structure of a multilayer substrate 10 according to a first embodiment of the present disclosure will be described with reference to the drawings. FIG. 1 is an exploded perspective view illustrating the multilayer substrate 10. FIG. 2 is a cross-sectional view illustrating the multilayer substrate 10 taken along line A-A in FIG. 1. FIG. 3 is a top view illustrating a connection conductor layer 24.

In the following description, the up-down direction is defined as the direction in which layers of a multilayer body 12 of the multilayer substrate 10 are laminated. The up-down direction corresponds to the Z-axis direction. The upward direction is directed toward the positive side of the Z-axis. The downward direction is directed toward the negative side of the Z-axis. When the multilayer substrate 10 is viewed in the up-down direction, the front-back direction and the right-left direction are defined as the directions in which the sides of the multilayer substrate 10 extend. The right-left direction corresponds to the X-axis direction. The front-back direction corresponds to the Y-axis direction. The right-left direction orthogonally intersects the up-down direction. The front-back direction orthogonally intersects the up-down direction and the right-left direction. Note that the above definitions of directions are merely examples. Accordingly, the directions used in the present specification do not necessarily reflect actual directions when the multilayer substrate 10 is in use. In the drawings, the up-down direction may be reversed. In the drawings, the right-left direction may be reversed. In the drawings, the front-back direction may be reversed.

Let X represents a component or a member of the multilayer substrate 10 in this paragraph. In the present specification, portions of X are defined as follows unless otherwise specified. A "front portion" of X means a front half portion of X. A "back portion" of X means a back half portion of X. A "left portion" of X means a left half portion of X. A "right portion" of X means a right half portion of X. An "upper portion" of X means an upper half portion of X. A "lower portion" of X means a lower half portion of X. A "front end" of X means a frontward end of X. A "back end" of X means a backward end of X. A "left end" of X means a leftward end of X. A "right end" of X means a rightward end of X. An "upper end" of X means an upward end of X. A "lower end" of X means a downward end of X. A "front end portion" of X means the front end and its vicinity of X. A "back end portion" of X means the back end and its vicinity of X. A "left end portion" of X means the left end and its vicinity of X. A "right end portion" of X means the right end and its vicinity of X. An "upper end portion" of X means the upper end and its vicinity of X. A "lower end portion" of X means the lower end and its vicinity of X.

The multilayer substrate 10 is used, for example, in an electronic device, such as a mobile phone. As illustrated in FIG. 1, the multilayer substrate 10 includes a multilayer body 12, a second ground conductor layer 18, a radiation conductor layer 20, connection conductor layers 22a, 22b, and 24, a signal conductor layer 26, a first ground conductor layer 28, and inter-layer connection conductors v1 to v4.

The multilayer body 12 is shaped tabularly. The multilayer body 12 has a structure in which insulator layers 14a to 14g and protective layers 15a to 15c are laminated in the Z-axis direction. The insulator layers 14a to 14d and the protective layer 15a are shaped rectangularly as viewed in the up-down direction. The insulator layers 14e to 14g and the protective layers 15b and 15c are shaped like a belt elongated in the right-left direction as viewed in the up-down direction. The protective layer 15a, the insulator layers 14a to 14f, and the protective layer 15b are disposed in this order from the top. The insulator layers 14e and 14f and the protective layer 15b are elongated rightward from the insulator layers 14a to 14d as viewed in the up-down direction.

The insulator layer 14g is laminated on the insulator layer 14e. The insulator layer 14g is positioned to the right of the insulator layer 14d. Note that the insulator layer 14g is not in contact with the insulator layer 14d. The protective layer 15c is laminated on the insulator layer 14g.

Each of the insulator layers 14a to 14g and the protective layers 15a to 15c has an upper principal surface (i.e., positive-side principal surface) and a lower principal surface (i.e., negative-side principal surface) that is positioned lower than the upper principal surface (closer to the negative side of Z-axis). Among the insulator layers 14a to 14g, the insulator layer 14d is an intermediate insulator layer, and the insulator layer 14e is a negative-side adjoining insulator layer. The insulator layer 14e or the negative-side adjoining insulator layer is positioned below the insulator layer 14d or the intermediate insulator layer (i.e., positioned closer to the negative side of Z-axis than the intermediate insulator layer). The insulator layer 14e or the negative-side adjoining insulator layer is in contact with the insulator layer 14d or the intermediate insulator layer.

The insulator layers 14a to 14g are made of a thermoplastic resin, such as polyimide or a liquid crystal polymer. The protective layers 15a to 15c are insulating coats applied on the upper principal surface or the lower principal surface of the insulator layer. The protective layers 15a to 15c protect the radiation conductor layer 20, the first ground conductor layer 28, and the second ground conductor layer 18, respectively. The multilayer body 12 structured as above has flexibility.

As illustrated in FIG. 2, the multilayer body 12 is divided into a first segment A1, a second segment A2, and a third segment A3, which are disposed in this order in right-left direction (in the X-axis direction that orthogonally intersects the Z-axis direction). The first segment A1, the second segment A2, and the third segment A3 are disposed side by side in this order from left to right. In the up-down direction (in the Z-axis direction), the thickness of the first segment A1 is greater than the thickness of the second segment A2. In the up-down direction (in the Z-axis direction), the thickness of the third segment A3 is greater than the thickness of the second segment A2. In the up-down direction (in the Z-axis direction), the thickness of the third segment A3 is smaller than the thickness of the first segment A1.

In addition, as illustrated in FIG. 2, the multilayer body 12 includes a first multilayer portion 12a and a second multilayer portion 12b. The first multilayer portion 12a includes the insulator layers 14a to 14c that are positioned above the insulator layer 14d or the intermediate insulator layer (i.e., positioned closer to the positive side of Z-axis than the intermediate insulator layer). The first multilayer portion 12a also includes the insulator layer 14d or the intermediate insulator layer and the protective layer 15a. The second multilayer portion 12b includes the insulator layer 14e and 14f that are positioned below the insulator layer 14d or the intermediate insulator layer (i.e., positioned closer to the negative side of Z-axis than the intermediate insulator layer). The second multilayer portion 12b also includes the insulator layer 14g and the protective layers 15b and 15c. The first multilayer portion 12a and the second multilayer portion 12b are formed separately using thermocompression bonding. The multilayer body 12 is subsequently formed by combining the first multilayer portion 12a and the second multilayer portion 12b together using the thermocompression bonding.

The radiation conductor layer 20 functions as a patch antenna. The radiation conductor layer 20 radiates and/or receives high-frequency signals. As illustrated in FIG. 1, the radiation conductor layer 20 is disposed in the multilayer body 12. The radiation conductor layer 20 is positioned above the insulator layer 14d or the intermediate insulator layer (i.e., positioned closer to the positive side of Z-axis than the intermediate insulator layer). More specifically, the radiation conductor layer 20 is positioned on the upper principal surface of the insulator layer 14a. The radiation conductor layer 20 is shaped like a rhombus of which the diagonal lines extend in the right-left direction and in the front-back direction as viewed in the up-down direction.

The signal conductor layer 26 transmits high-frequency signals. As illustrated in FIG. 1, the signal conductor layer 26 is formed in the multilayer body 12. The signal conductor layer 26 is positioned below the insulator layer 14d or the intermediate insulator layer (i.e., positioned closer to the negative side of Z-axis than the intermediate insulator layer). More specifically, the signal conductor layer 26 is positioned on the lower principal surface of the insulator layer 14e. The signal conductor layer 26 is shaped like a line extending in the right-left direction as viewed in the up-down direction. As illustrated in FIG. 2, the signal conductor layer 26 is present in the first segment A1, the second segment A2, and the third segment A3.

The connection conductor layer 24 transmits high-frequency signals. The connection conductor layer 24 is disposed in the multilayer body 12. The connection conductor layer 24 is positioned on the lower principal surface (negative-side principal surface) of the insulator layer 14d or the intermediate insulator layer. The connection conductor layer 24 is shaped like a line extending in the right-left direction as viewed in the up-down direction. A right end portion of the connection conductor layer 24 overlaps a left end portion of the signal conductor layer 26 as viewed in the up-down direction. As illustrated in FIG. 2, the connection conductor layer 24 is positioned in the first segment A1. The connection conductor layer 24 is not present in the second segment A2 nor in the third segment A3.

The first ground conductor layer 28 is connected to a ground potential. The first ground conductor layer 28 is disposed in the multilayer body 12. The first ground conductor layer 28 is positioned below the connection conductor layer 24 and the signal conductor layer 26 (i.e., positioned closer to the negative side of Z-axis than the connection conductor layer 24 and the signal conductor layer 26). The first ground conductor layer 28 is positioned on the lower principal surface of the insulator layer 14f. The first ground conductor layer 28 covers the lower principal surface of the insulator layer 14f almost entirely. Accordingly, as viewed in the up-down direction (in the Z-axis direction), the first ground conductor layer 28 overlaps the connection conductor layer 24 at least partially and also overlaps the signal conductor layer 26 at least partially. In the present embodiment, as viewed in the up-down direction, the first ground conductor layer 28 overlaps the connection conductor layer 24 entirely and the signal conductor layer 26 entirely. No conductor is present between the first ground conductor layer 28 and the connection conductor layer 24. No conductor is present between the first ground conductor layer 28 and the signal conductor layer 26. Moreover, the first ground conductor layer 28 overlaps the radiation conductor layer 20 as viewed in the up-down direction (in the Z-axis direction). The first ground conductor layer 28 structured as above is positioned in the first segment A1, the second segment A2, and the third segment A3.

The second ground conductor layer 18 is connected to a ground potential. The second ground conductor layer 18 is disposed in the multilayer body 12. The second ground conductor layer 18 is positioned above the signal conductor layer 26 (i.e., positioned closer to the positive side of Z-axis than the signal conductor layer 26). The second ground conductor layer 18 is positioned on the upper principal surface of the insulator layer 14g. The second ground conductor layer 18 covers the upper principal surface of the insulator layer 14g almost entirely. Accordingly, as viewed in the up-down direction (in the Z-axis direction), the second ground conductor layer 18 overlaps the signal conductor layer 26 at least partially. In the present embodiment, as viewed in the up-down direction, the second ground conductor layer 18 overlaps the signal conductor layer 26 entirely. No conductor except for the inter-layer connection conductor v4 and the first ground conductor layer 28 is present between the second ground conductor layer 18 and the signal conductor layer 26. The second ground conductor layer 18 structured as above is positioned in the third segment A3. The second ground conductor layer 18 is not present in the first segment A1 nor in the second segment A2.

Consequently, the signal conductor layer 26 forms a microstrip line structure together with the first ground conductor layer 28 in the first segment A1 and the second segment A2. The signal conductor layer 26 forms a strip line structure together with the first ground conductor layer 28 and the second ground conductor layer 18 in the third segment A3. The characteristic impedance of the signal conductor layer 26 is predetermined (50Ω).

The connection conductor layer 22a is positioned on the upper principal surface of the insulator layer 14b. The connection conductor layer 22a is shaped like a line extending in the right-left direction. As viewed in the up-down direction, a left end portion of the connection conductor layer 22a overlaps the radiation conductor layer 20.

The connection conductor layer 22b is positioned on the upper principal surface of the insulator layer 14c. The connection conductor layer 22b is shaped like a line extending in the right-left direction. As viewed in the up-down direction, a left end portion of the connection conductor layer 22b overlaps a left end portion of the connection conductor layer 24. As viewed in the up-down direction, a right end portion of the connection conductor layer 22b overlaps a right end portion of the connection conductor layer 22a.

The inter-layer connection conductor v1 pierces through the insulator layer 14a in the up-down direction. The inter-layer connection conductor v1 is in contact with the radiation conductor layer 20 and also with the left end portion of the connection conductor layer 22a. The inter-layer connection conductor v1 thereby electrically connects the radiation conductor layer 20 to the connection conductor layer 22a.

The inter-layer connection conductor v2 pierces through the insulator layer 14b in the up-down direction. The inter-layer connection conductor v2 is in contact with the right end portion of the connection conductor layer 22a and also with the right end portion of the connection conductor layer 22b. The inter-layer connection conductor v2 thereby electrically connects the connection conductor layer 22a to the connection conductor layer 22b.

The inter-layer connection conductor v3 is an example of a second inter-layer connection conductor. The inter-layer connection conductor v3 pierces through the insulator layer 14d (i.e., the intermediate insulator layer) and through the insulator layer 14c in the up-down direction (in the Z-axis direction). The inter-layer connection conductor v3 is in contact with the left end portion of the connection conductor layer 22b and also with the left end portion of the connection conductor layer 24. The inter-layer connection conductor v3 thereby electrically connects the connection conductor layer 22b to the connection conductor layer 24. Accordingly, the inter-layer connection conductor v3 is electrically connected to the radiation conductor layer 20.

The inter-layer connection conductor v4 is an example of a first inter-layer connection conductor. The inter-layer connection conductor v4 pierces through the insulator layer 14e (i.e., the negative-side adjoining insulator layer) in the up-down direction (in the Z-axis direction). The inter-layer connection conductor v4 is in contact with the right end portion of the connection conductor layer 24 and also with the left end portion of the signal conductor layer 26. The inter-layer connection conductor v4 thereby electrically connects the connection conductor layer 24 to the signal conductor layer 26. Accordingly, the inter-layer connection conductor v4 is electrically connected to the signal conductor layer 26.

The current path from the inter-layer connection conductor v3 to the radiation conductor layer 20 is shorter than the current path from the inter-layer connection conductor v4 (to be described later) to the radiation conductor layer 20. The current path from the inter-layer connection conductor v4 to the signal conductor layer 26 is shorter than the current path from the inter-layer connection conductor v3 to the signal conductor layer 26.

The second ground conductor layer 18, the radiation conductor layer 20, the connection conductor layers 22a, 22b, and 24, the signal conductor layer 26, and the first ground conductor layer 28 are formed by patterning metal foils adhered onto respective upper or lower principal surfaces of the insulator layers 14a to 14g. For example, the metal foils are made of copper. The inter-layer connection conductor v1 to v3 are formed, for example, by stuffing a conductive paste into respective through-holes piercing the insulator layers 14a to 14d in the up-down direction and then by heating and setting the conductive paste. The inter-layer connection conductor v4 is formed by stuffing solder into the through-hole piercing the insulator layer 14e in the up-down direction. In other words, the inter-layer connection conductor v3, which is the second inter-layer connection conductor, is made of a different material from that of the inter-layer connection conductor v4, which is the first inter-layer connection conductor.

Next, the structure of the connection conductor layer 24 will be described in detail with reference to FIG. 3. A longitudinal direction of the connection conductor layer 24 is defined as a direction in which the connection conductor layer 24 is elongated. The longitudinal direction corresponds to the right-left direction. A line width direction of the connection conductor layer 24 is defined as a direction that orthogonally intersects both the longitudinal direction and the up-down direction (Z-axis direction). The line width direction corresponds to the front-back direction.

The connection conductor layer 24 includes a first connection portion A11, a second connection portion A12, a transmission line portion A31, a first intermediate portion A21, and a second intermediate portion A22. The first connection portion A11, the first intermediate portion A21, the transmission line portion A31, the second intermediate portion A22, and the second connection portion A12 are disposed in this order from right to left. The first intermediate portion A21 adjoins the first connection portion A11. The second intermediate portion A22 adjoins the second connection portion A12. The transmission line portion A31 adjoins both the first intermediate portion A21 and the second intermediate portion A22. The first connection portion A11 is positioned at the right end portion (first end portion) of the connection conductor layer 24 in the longitudinal direction. The second connection portion A12 is positioned at the left end portion (second end portion) of the connection conductor layer 24 in the longitudinal direction. Accordingly, the right end of the first connection portion A11 coincides with the right end of the connection conductor layer 24. The left end of the second connection portion A12 coincides with the left end of the connection conductor layer 24.

The inter-layer connection conductor v4 (the first inter-layer connection conductor) is in contact with the first connection portion A11. In the right-left direction (i.e., the longitudinal direction), opposite ends of the first connection portion A11 are positioned equidistantly from the center of the inter-layer connection conductor v4 (i.e., the first inter-layer connection conductor) as viewed in the up-down direction (in the Z-axis direction). Accordingly, the distance from the center of the inter-layer connection conductor v4 to the left end of the first connection portion A11 is equal to the distance from the center of the inter-layer connection conductor v4 to the right end of the first connection portion A11.

The inter-layer connection conductor v3 (i.e., the second inter-layer connection conductor) is in contact with the second connection portion A12. In the right-left direction (i.e., in the longitudinal direction), opposite ends of the second connection portion A12 are positioned equidistantly from the center of the inter-layer connection conductor v3 (the second inter-layer connection conductor) as viewed in the up-down direction (in the Z-axis direction). Accordingly, the distance from the center of the inter-layer connection conductor v3 to the left end of the second connection portion A12 is equal to the distance from the center of the inter-layer connection conductor v3 to the right end of the second connection portion A12. In the front-back direction (in the line width direction), a maximum width of the second connection portion A12 is smaller than a maximum width of the first connection portion A11. The first connection portion A11 and the second connection portion A12 are shaped circularly. The diameter of the second connection portion A12 is smaller than the diameter of the first connection portion A11.

The first intermediate portion A21 includes a first thin-line portion A21a and a first thick-line portion A21b. In the front-back direction (in the line width direction), the width of the first thin-line portion A21a is smaller than the width of a second thick-line portion A22b. The first thick-line portion A21b adjoins the transmission line portion A31. In the front-back direction (in the line width direction), the width of the first thick-line portion A21b is greater than the width of the transmission line portion A31.

The second intermediate portion A22 includes a second thin-line portion A22a and a second thick-line portion A22b. In the front-back direction (in the line width direction), the width of the second thin-line portion A22a is smaller than the width of the second thick-line portion A22b. The second thick-line portion A22b adjoins the transmission line portion A31. In the front-back direction (in the line width direction), the width of the second thick-line portion A22b is greater than the width of the transmission line portion A31.

Advantageous Effect

Figure 4:
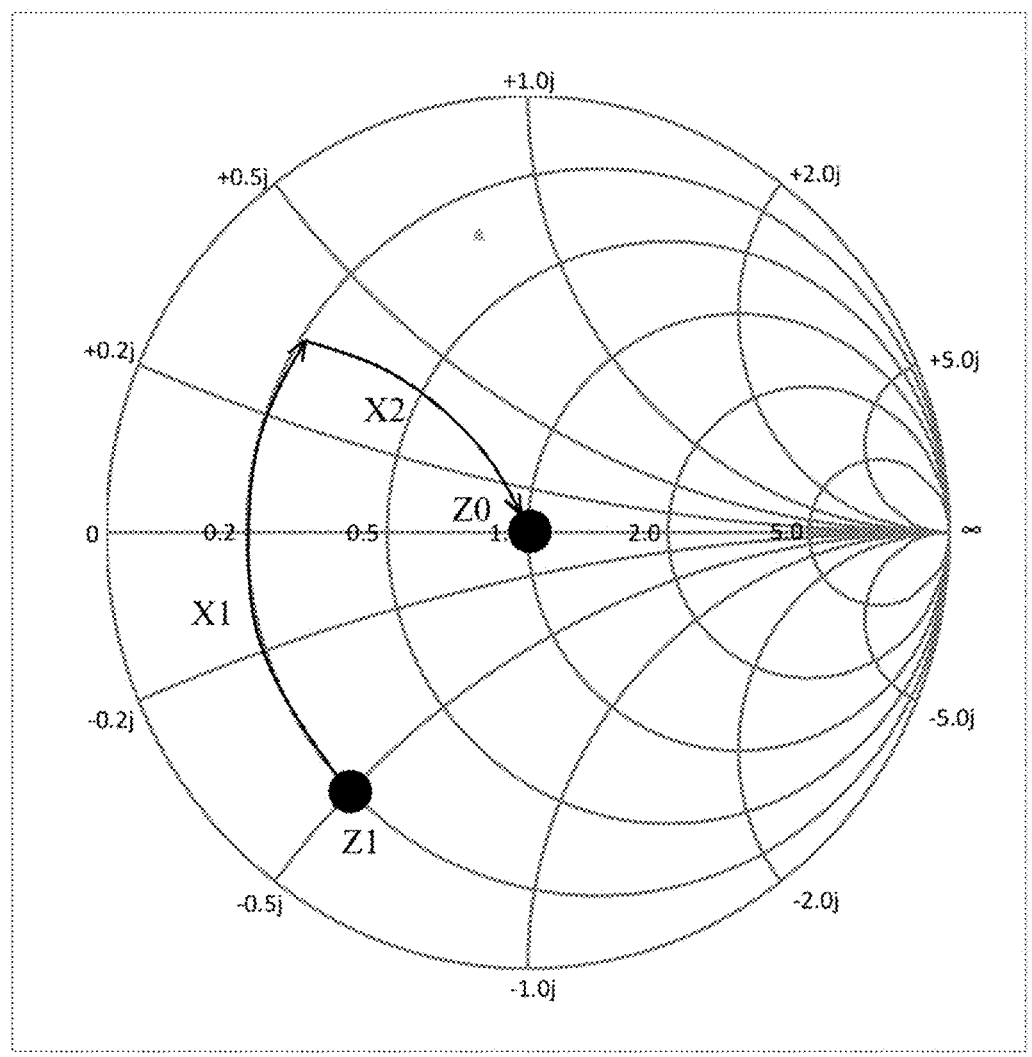
FIG. 4 is a Smith chart.

The multilayer substrate 10 can reduce the occurrence of mismatch in characteristic impedance between the signal conductor layer 26 and the radiation conductor layer 20. The following describes this point with reference to the drawings. FIG. 4 is a Smith chart. Z0 denotes the characteristic impedance produced in the transmission line portion A31. Z0 is 50Ω. Z1 denotes the characteristic impedance produced in the first connection portion A11. For example, Z1 is 20Ω.

More specifically, in the line width direction, the width of the first connection portion A11 and the width of the second connection portion A12 of the connection conductor layer 24 are greater than the width of the transmission line portion A31 in the multilayer substrate 10. The first connection portion A11 is in contact with the inter-layer connection conductor v4. The second connection portion A12 is in contact with the inter-layer connection conductor v3. As a result, in the connection conductor layer 24, the characteristic impedance produced in the first connection portion A11 and the characteristic impedance produced in the second connection portion A12 tend to deviate from the predetermined characteristic impedance (50Ω).

However, the connection conductor layer 24 includes the first intermediate portion A21. The first intermediate portion A21 includes the first thin-line portion A21a of which the width is smaller than the width of the second thick-line portion A22b in the line width direction. The first intermediate portion A21 adjoins the first connection portion A11. Accordingly, the first thin-line portion A21a functions to provide inductance. In other words, an inductor is connected in series to the transmission line portion A31. Accordingly, the first thin-line portion A21a rotates the impedance clockwise from Z1 as indicated by arrow X1 in the Smith chart of FIG. 4.

In addition, the first intermediate portion A21 includes the first thick-line portion A21b of which the width is greater than that of the transmission line portion A31 in the line width direction. The first thick-line portion A21b adjoins the transmission line portion A31. The first thick-line portion A21b overlaps the first ground conductor layer 28 as viewed in the up-down direction. Accordingly, the first thick-line portion A21b produces capacitance. In other words, a capacitor is connected in parallel to the transmission line portion A31. Accordingly, the first thick-line portion A21b rotates the impedance clockwise from the tip end of arrow X1 as indicated by arrow X2 in the Smith chart of FIG. 4.

As a result, the first intermediate portion A21 causes the characteristic impedance of the first connection portion A11 to match the characteristic impedance of the transmission line portion A31. In the same principle, the second intermediate portion A22 causes the characteristic impedance of the second connection portion A12 to match the characteristic impedance of the transmission line portion A31, of which the details are omitted here. Accordingly, the multilayer substrate 10 reduces the occurrence of mismatch in characteristic impedance between the signal conductor layer 26 and the radiation conductor layer 20. As a result of the reduction in the occurrence of mismatch in characteristic impedance between the signal conductor layer 26 and the radiation conductor layer 20, the bandwidth of the multilayer substrate 10 is broadened.

In the multilayer substrate 10, the first connection portion A11 is in secure contact with the inter-layer connection conductor v4. More specifically, the multilayer body 12 is formed by combining the first multilayer portion 12a and the second multilayer portion 12b together using the thermocompression bonding after the first multilayer portion 12a and the second multilayer portion 12b are formed separately using thermocompression bonding. The inter-layer connection conductor v4 is joined to the first connection portion A11 during the thermocompression bonding of the first multilayer portion 12a and the second multilayer portion 12b. In the line width direction, a maximum width of the first connection portion A11 is greater than a maximum width of the second connection portion A12. As a result, the inter-layer connection conductor v4 can be joined to the first connection portion A11 more securely.

(First Modification)

A connection conductor layer 24a according to a first modification will be described with reference to the drawings. FIG. 5 is a top view illustrating the connection conductor layer 24a.

The connection conductor layer 24a is different from the connection conductor layer 24 in the following points. In the line width direction, a width w1 of the first thick-line portion A21b is greater than a width w2 of the second thick-line portion A22b. In the line width direction, a width w11 of the first thin-line portion A21a and a width w12 of the second thin-line portion A22a are smaller than a width w3 of the transmission line portion A31.

Other structural features of the connection conductor layer 24a are the same as those of the connection conductor layer 24, and duplicated descriptions are omitted. The multilayer substrate 10 having the connection conductor layer 24a provides the same advantageous effects as those of the multilayer substrate 10 having the connection conductor layer 24.

In the multilayer substrate 10 having the connection conductor layer 24a, the first intermediate portion A21 causes the characteristic impedance of the first connection portion A11 to match the characteristic impedance of the transmission line portion A31. In the line width direction, a maximum width of the first connection portion A11 is greater than a maximum width of the second connection portion A12. As a result, the characteristic impedance of the first connection portion A11 is smaller than the characteristic impedance of the second connection portion A12. In other words, the difference between the characteristic impedance of the first connection portion A11 and the predetermined characteristic impedance (50Ω) becomes greater. However, the width w1 of the first thick-line portion A21b is greater than the width w2 of the second thick-line portion A22b in the line width direction. This increases the capacitance generated in the first thick-line portion A21b. In the line width direction, the width w11 of the first thin-line portion A21a and the width w12 of the second thin-line portion A22a are smaller than the width w3 of the transmission line portion A31. This increases the inductance generated in the first thin-line portion A21a. As a result, the first intermediate portion A21 causes the characteristic impedance of the first connection portion A11 to match the characteristic impedance of the transmission line portion A31.

(Second Modification)

A connection conductor layer 24b according to a second modification will be described with reference to the drawings. FIG. 6 is a top view illustrating the connection conductor layer 24b.

The connection conductor layer 24b is different from the connection conductor layer 24a in the shapes of the first thick-line portion A21b and the second thick-line portion A22b. In the connection conductor layer 24b, the first thick-line portion A21b and the second thick-line portion A22b have tapered shapes. Each of the first thick-line portion A21b and the second thick-line portion A22b is shaped such that the width in the line width direction becomes smaller toward the transmission line portion A31. This suppresses a sudden change in characteristic impedance in the first thick-line portion A21b and the second thick-line portion A22b. Other structural features of the connection conductor layer 24b are the same as those of the connection conductor layer 24a. The multilayer substrate 10 having the connection conductor layer 24b provides the same advantageous effects as those of the multilayer substrate 10 having the connection conductor layer 24a.

(Third Modification)

A connection conductor layer 24c according to a third modification will be described with reference to the drawings. FIG. 7 is a top view illustrating the connection conductor layer 24c.

The connection conductor layer 24c is different from the connection conductor layer 24 in that the connection conductor layer 24c does not include the first and second thin-line portions A21a and A22a. The first thick-line portion A21b adjoins the first connection portion A11. The second thick-line portion A22b adjoins the second connection portion A12. Other structural features of the connection conductor layer 24c are the same as those of the connection conductor layer 24, and duplicated descriptions are omitted.

Figure 8:
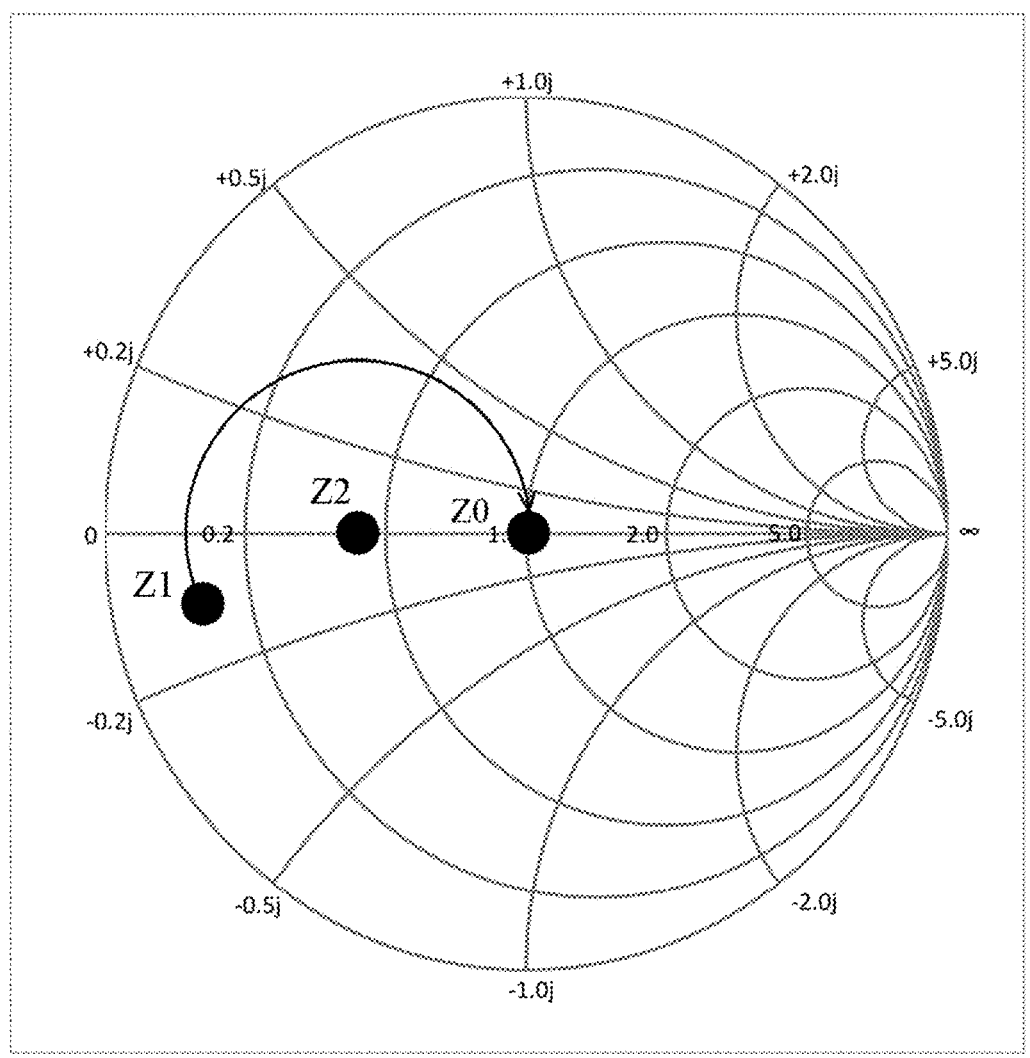
FIG. 8 is another Smith chart.

The multilayer substrate 10 having the connection conductor layer 24c can reduce the occurrence of mismatch in characteristic impedance between the signal conductor layer 26 and the radiation conductor layer 20. The following describes this point with reference to the drawings. FIG. 8 is a Smith chart. Z0 denotes the characteristic impedance produced in the transmission line portion A31. Z0 is 50Ω. Z1 denotes the characteristic impedance of the first connection portion A11. For example, Z1 is 20Ω.

More specifically, in the line width direction, the width of the first connection portion A11 and the width of the second connection portion A12 of the connection conductor layer 24c are greater than the width of the transmission line portion A31 in the multilayer substrate 10. The first connection portion A11 is in contact with the inter-layer connection conductor v4. The second connection portion A12 is in contact with the inter-layer connection conductor v3. As a result, in the connection conductor layer 24c, the characteristic impedance produced in the first connection portion A11 and the characteristic impedance produced in the second connection portion A12 tend to deviate from the predetermined characteristic impedance (50Ω).

However, the connection conductor layer 24c includes the first intermediate portion A21. The first thick-line portion A21b overlaps the first ground conductor layer 28 as viewed in the up-down direction. Accordingly, the first thick-line portion A21b functions as a transmission line. In addition, the first intermediate portion A21 includes the first thick-line portion A21b of which the width is greater than that of the transmission line portion A31 in the line width direction. As a result, the characteristic impedance Z2 of the first thick-line portion A21b is smaller than the predetermined characteristic impedance (50Ω). Accordingly, the impedance is shifted so as to follow a circumference of a circle of which the circumference passes Z0 and the center is positioned at the characteristic impedance Z2 of the first thick-line portion A21b. With this configuration, the characteristic impedance Z2 of the first thick-line portion A21b and the length of the first thick-line portion A21b are set appropriately. As a result, the first intermediate portion A21 causes the characteristic impedance of the first connection portion A11 to match the characteristic impedance of the transmission line portion A31. In the same principle, the second intermediate portion A22 causes the characteristic impedance of the second connection portion A12 to match the characteristic impedance of the transmission line portion A31, of which the details are omitted here. Accordingly, the multilayer substrate 10 having the connection conductor layer 24c can reduce the occurrence of mismatch in characteristic impedance between the signal conductor layer 26 and the radiation conductor layer 20.

(Fourth Modification)

A connection conductor layer 24d according to a fourth modification will be described with reference to the drawings. FIG. 9 is a top view illustrating the connection conductor layer 24d.

The connection conductor layer 24d is different from the connection conductor layer 24 in that the transmission line portion A31 of the connection conductor layer 24d is bent as viewed in the up-down direction. In other words, the transmission line portion A31 is not necessarily shaped linearly. Other structural features of the connection conductor layer 24d are the same as those of the connection conductor layer 24, and duplicated descriptions are omitted. The multilayer substrate 10 having the connection conductor layer 24d provides the same advantageous effects as those of the multilayer substrate 10 having the connection conductor layer 24.

Second Embodiment

Figure 10:
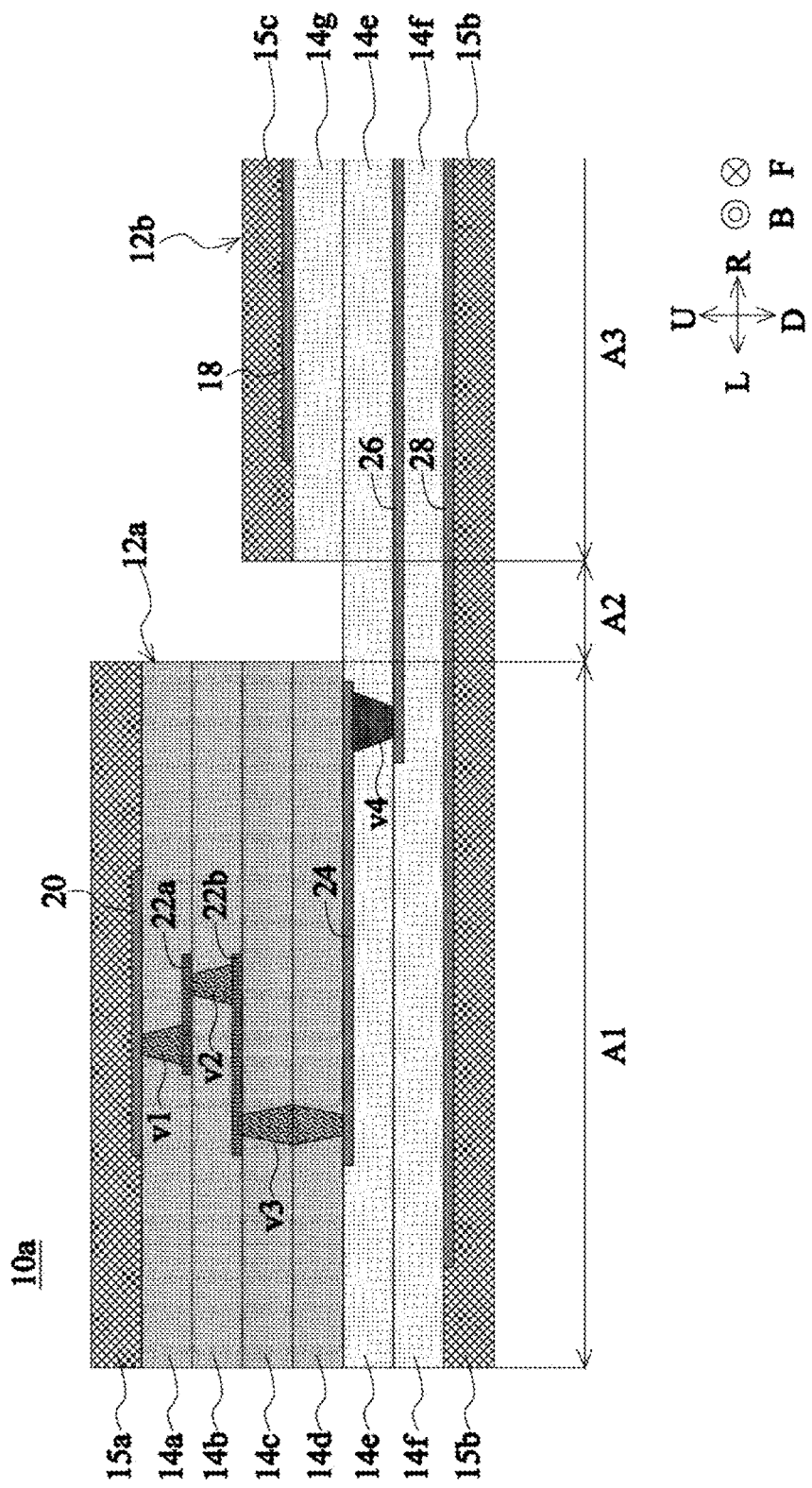

A multilayer substrate 10a according to a second embodiment will be described with reference to the drawings. FIG. 10 is a cross-sectional view illustrating the multilayer substrate 10a.

The multilayer substrate 10a is different from the multilayer substrate 10 in that main insulating materials of the first multilayer portion 12a and the second multilayer portion 12b are different from each other. The main insulating material of the second multilayer portion 12b has a Young's modulus smaller than that of the main insulating material of the first multilayer portion 12a. The first multilayer portion 12a is made of Teflon® or FR-4. The second multilayer portion 12b is made, for example, of polyimide or a liquid crystal polymer. Other structural features of the multilayer substrate 10a are the same as those of the multilayer substrate 10, and duplicated descriptions are omitted. The multilayer substrate 10a can provide the same advantageous effects as those of the multilayer substrate 10.

In the multilayer substrate 10a, the main insulating material of the second multilayer portion 12b has a Young's modulus smaller than that of the main insulating material of the first multilayer portion 12a. As a result, the second multilayer portion 12b can be formed into a desired shape easily.

Third Embodiment

Figure 11:
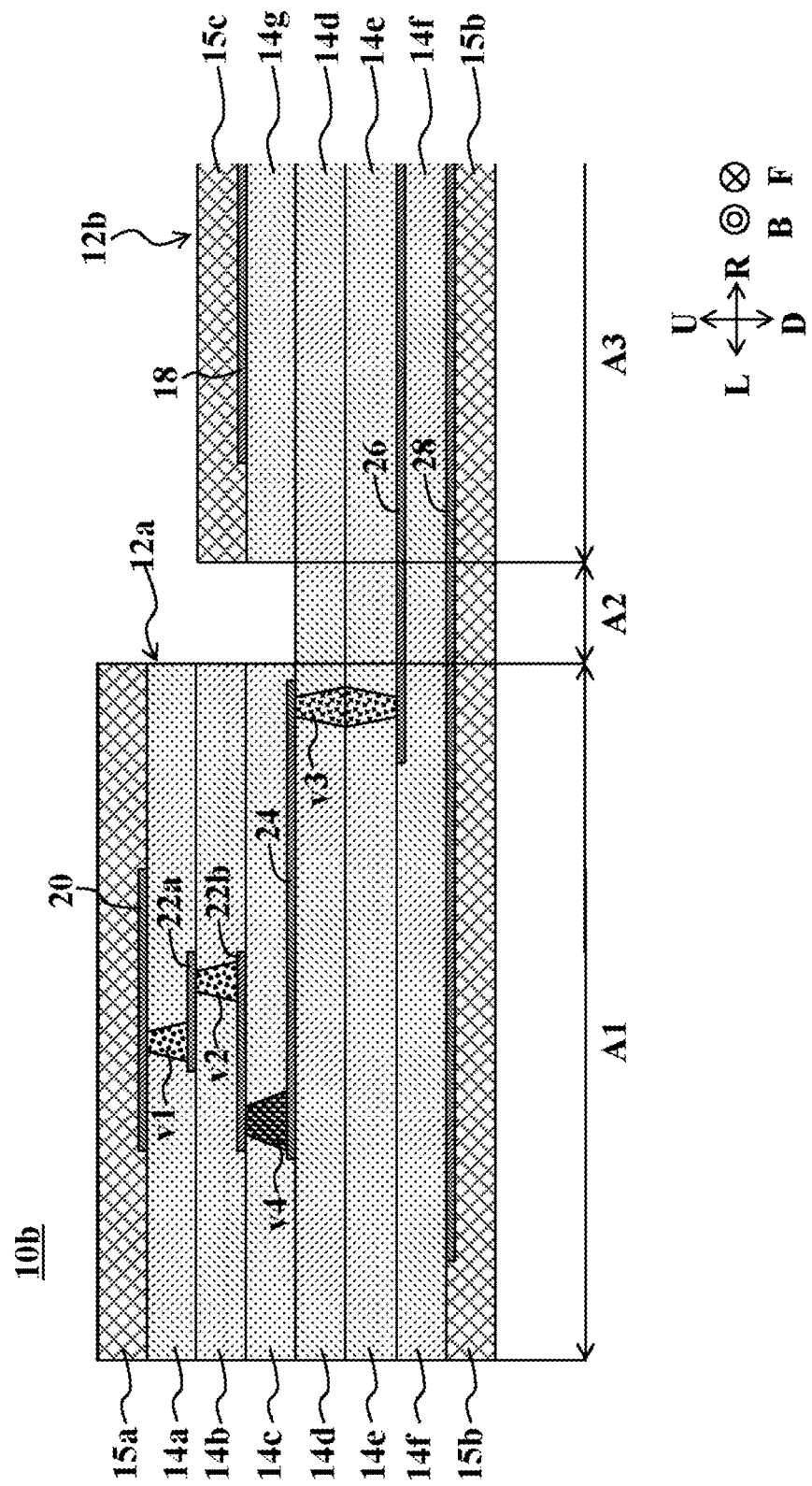
FIG. 11 is a cross-sectional view illustrating a multilayer substrate 10b.

A multilayer substrate 10b according to a third embodiment will be described with reference to the drawings. FIG. 11 is a cross-sectional view illustrating the multilayer substrate 10b. FIG. 12 is a top view illustrating the connection conductor layer 24 disposed in the multilayer substrate 10b.

The multilayer substrate 10b is different from the multilayer substrate 10 mainly in that the inter-layer connection conductor v3 is positioned closer to the signal conductor layer 26 and the inter-layer connection conductor v4 is positioned closer to the radiation conductor layer 20 in the multilayer substrate 10b.

In the third embodiment, the insulator layer 14d in addition to the insulator layers 14e and 14f is also elongated rightward from the insulator layers 14a to 14c. The insulator layer 14g is laminated on the insulator layer 14d. In the third embodiment, the insulator layer 14c corresponds to the intermediate insulator layer, and the insulator layer 14d corresponds to the negative-side adjoining insulator layer.

The first multilayer portion 12a includes the insulator layers 14a to 14c and the protective layers 15a. The second multilayer portion 12b includes the insulator layers 14d to 14g and the protective layers 15b and 15c. The first multilayer portion 12a and the second multilayer portion 12b are formed separately using thermocompression bonding. The multilayer body 12 is subsequently formed by combining the first multilayer portion 12a and the second multilayer portion 12b together using the thermocompression bonding.

The connection conductor layer 24 is positioned on the upper principal surface of the insulator layer 14d. As illustrated in FIG. 12, the connection conductor layer 24 is disposed such that the direction from the first connection portion A11 to the second connection portion A12 corresponds to the rightward direction. In the third embodiment, the first end portion of the connection conductor layer 24 corresponds to the left end portion thereof, and the second end portion of the connection conductor layer 24 corresponds to the right end portion thereof.

The inter-layer connection conductor v3 pierces through the insulator layers 14d and 14e in the up-down direction. The inter-layer connection conductor v3 is in contact with the right end portion of the connection conductor layer 24, which is the second connection portion A12 of the connection conductor layer 24, and also in contact with the left end portion of the signal conductor layer 26. The inter-layer connection conductor v3 thereby electrically connects the connection conductor layer 24 to the signal conductor layer 26. Accordingly, the inter-layer connection conductor v3 is electrically connected to the signal conductor layer 26.

The inter-layer connection conductor v4 pierces through the insulator layer 14c in the up-down direction. The inter-layer connection conductor v4 is in contact with the left end portion of the connection conductor layer 22b and also with the left end portion of the connection conductor layer 24, which is the first connection portion A11 of the connection conductor layer 24. The inter-layer connection conductor v4 thereby electrically connects the connection conductor layer 22b to the connection conductor layer 24. Accordingly, the inter-layer connection conductor v4 is electrically connected to the radiation conductor layer 20.

The current path from the inter-layer connection conductor v4 to the radiation conductor layer 20 is shorter than the current path from the inter-layer connection conductor v3 to the radiation conductor layer 20. The current path from the inter-layer connection conductor v3 to the signal conductor layer 26 is shorter than the current path from the inter-layer connection conductor v4 to the signal conductor layer 26.

Other structural features of the multilayer substrate 10b are the same as those of the multilayer substrate 10, and duplicated descriptions are omitted. The multilayer substrate 10b provides the same advantageous effects as those of the multilayer substrate 10.

Other Embodiments

The multilayer substrate of the present disclosure is not limited to the multilayer substrate 10, 10a, or 10b but can be modified within the scope of the disclosure. The structural features of the multilayer substrates 10, 10a, and 10b can be combined in an arbitrary manner. Moreover, the structural features of the connection conductor layers 24 and 24a to 24d can be combined in an arbitrary manner.

In the line width direction, the width of the first thick-line portion A21b can be equal to or smaller than the width of the second thick-line portion A22b.

In the line width direction, the width of the first thin-line portion A21a and the width of the second thin-line portion A22a can be equal to or greater than the width of the transmission line portion A31.

The multilayer substrate 10, 10a, or 10b can further include another ground conductor that is positioned above the signal conductor layer 26 and overlaps the signal conductor layer 26 as viewed in the up-down direction.

The multilayer body 12 does not need to have flexibility.

The insulator layers 14a to 14g can be made of a material other than the thermoplastic resin.

The material of the inter-layer connection conductor v3, which is the second inter-layer connection conductor, can be the same as the material of the inter-layer connection conductor v4, which is the first inter-layer connection conductor.

The multilayer substrate of the present disclosure has the following structural features.

(1) A multilayer substrate includes i) a multilayer body in which multiple insulator layers including an intermediate insulator layer and a negative-side adjoining insulator layer are laminated in a Z-axis direction, each one of the insulator layers having a positive-side principal surface and a negative-side principal surface positioned closer to a negative side of Z-axis than the positive-side principal surface, the negative-side adjoining insulator layer being positioned closer to the negative side of Z-axis than the intermediate insulator layer and adjoining the intermediate insulator layer; ii) a radiation conductor layer disposed in the multilayer body at a position closer to a positive side of Z-axis than the intermediate insulator layer; iii) a signal conductor layer disposed in the multilayer body at a position closer to the negative side of Z-axis than the intermediate insulator layer; iv) a connection conductor layer disposed on the negative-side principal surface of the intermediate insulator layer in the multilayer body, the connection conductor layer including a first connection portion, a second connection portion, a transmission line portion, a first intermediate portion, and a second intermediate portion, the first intermediate portion adjoining the first connection portion, the second intermediate portion adjoining the second connection portion, the transmission line portion adjoining the first intermediate portion and the second intermediate portion; v) a first ground conductor layer disposed in the multilayer body at a position closer to the negative side of Z-axis than the connection conductor layer and the signal conductor layer, the first ground conductor layer overlapping the connection conductor layer at least partially and also overlapping the signal conductor layer at least partially as viewed in the Z-axis direction; vi) a first inter-layer connection conductor being in contact with the first connection portion; and vii) a second inter-layer connection conductor being in contact with the second connection portion. One of the first inter-layer connection conductor and the second inter-layer connection conductor pierces through the intermediate insulator layer in the Z-axis direction and electrically connects the connection conductor layer and the radiation conductor layer to each other. The other one of the first inter-layer connection conductor and the second inter-layer connection conductor pierces through the negative-side adjoining insulator layer in the Z-axis direction and electrically connect the connection conductor layer and the signal conductor layer to each other. A longitudinal direction of the connection conductor layer is defined as a direction in which the connection conductor layer is elongated, and a line width direction of the connection conductor layer is defined as a direction orthogonally intersecting both the longitudinal direction and the Z-axis direction. The first connection portion is positioned at a first end portion of the connection conductor layer in the longitudinal direction, and the second connection portion is positioned at a second end portion of the connection conductor layer in the longitudinal direction. The first end portion and the second end portion of the connection conductor layer are positioned opposite to each other in the longitudinal direction. In the longitudinal direction, opposite ends of the first connection portion are positioned equidistantly from a center of the first inter-layer connection conductor as viewed in the Z-axis direction. In the longitudinal direction, opposite ends of the second connection portion are positioned equidistantly from a center of the second inter-layer connection conductor as viewed in the Z-axis direction. In the line width direction, a maximum width of the second connection portion is smaller than a maximum width of the first connection portion. The first intermediate portion includes a first thick-line portion of which a width is greater than that of the transmission line portion in the line width direction. The second intermediate portion includes a second thick-line portion of which a width is greater than that of the transmission line portion in the line width direction. The first thick-line portion and the second thick-line portion adjoin the transmission line portion.

(2) In the multilayer substrate described in (1) above, the width of the first thick-line portion is greater than that of the second thick-line portion in the line width direction.

(3) In the multilayer substrate described in (1) or (2) above, the first intermediate portion includes a first thin-line portion of which a width is smaller than the width of the first thick-line portion in the line width direction, and the second intermediate portion includes a second thin-line portion of which a width is smaller than the width of the second thick-line portion in the line width direction. In addition, the first thin-line portion adjoins the first connection portion, and the second thin-line portion adjoins the second connection portion.

(4) In the multilayer substrate described in (3) above, in the line width direction, the width of the first thin-line portion and the width of the second thin-line portion are smaller than the width of the transmission line portion.

(5) In the multilayer substrate described in any one of (1) to (4) above, the first ground conductor layer overlaps the radiation conductor layer as viewed in the Z-axis direction.

(6) In the multilayer substrate described in any one of (1) to (5) above, the multilayer body includes a first segment and a second segment that are positioned next to each other in an X-axis direction that orthogonally intersects the Z-axis direction. In the Z-axis direction, a thickness of the first segment is greater than a thickness of the second segment. The connection conductor layer is positioned in the first segment, and the signal conductor layer is positioned in the first segment and the second segment.

(7) In the multilayer substrate described in any one of (1) to (6), the multilayer body includes a first segment, a second segment, and a third segment that are positioned next to each other in this order in an X-axis direction that orthogonally intersects the Z-axis direction. In the Z-axis direction, a thickness of the first segment is greater than that of the second segment. In the Z-axis direction, a thickness of the third segment is greater than that of the second segment. The multilayer substrate further includes a second ground conductor layer positioned in the third segment and not positioned in the first segment nor in the second segment. The first ground conductor layer is positioned in the first segment, the second segment, and the third segment. The second ground conductor layer is positioned closer to the positive side of Z-axis than the signal conductor layer and overlaps the signal conductor layer at least partially as viewed in the Z-axis direction. The signal conductor layer forms a microstrip line structure together with the first ground conductor layer in the first segment and the second segment. The signal conductor layer forms a strip line structure together with the first ground conductor layer and the second ground conductor layer in the third segment.

(8) In the multilayer substrate described in any one of (1) to (7) above, the multilayer body includes a first multilayer portion and a second multilayer portion. The first multilayer portion includes the intermediate insulator layer and at least one insulator layer that is positioned closer to the positive side of Z-axis than the intermediate insulator layer. The second multilayer portion includes at least one insulator layer that is positioned closer to the negative side of Z-axis than the intermediate insulator layer. A main insulating material of the second multilayer portion is different from a main insulating material of the first multilayer portion.

(9) In the multilayer substrate described in (8), the main insulating material of the second multilayer portion has a Young's modulus smaller than that of the main insulating material of the first multilayer portion.

(10) In the multilayer substrate described in (8) or (9) above, a material of the second inter-layer connection conductor is different from that of the first inter-layer connection conductor.

(11) In the multilayer substrate described in any one of (1) to (10), the multilayer body has flexibility.

(12) In the multilayer substrate described in any one of (1) to (11), a material of the insulator layers is a thermoplastic resin.

What is claimed is:

1. A multilayer substrate comprising:
   a multilayer body in which multiple insulator layers including an intermediate insulator layer and a negative-side adjoining insulator layer are laminated in a Z-axis direction, each one of the multiple insulator layers having a positive-side principal surface and a negative-side principal surface positioned closer to a negative side of Z-axis than the positive-side principal surface, the negative-side adjoining insulator layer being positioned closer to the negative side of Z-axis than the intermediate insulator layer and adjoining the intermediate insulator layer;

a radiation conductor layer disposed in the multilayer body at a position closer to a positive side of Z-axis than the intermediate insulator layer;

a signal conductor layer disposed in the multilayer body at a position closer to the negative side of Z-axis than the intermediate insulator layer;

a connection conductor layer disposed on the negative-side principal surface of the intermediate insulator layer in the multilayer body, the connection conductor layer including a first connection portion, a second connection portion, a transmission line portion, a first intermediate portion, and a second intermediate portion; the first intermediate portion adjoining the first connection portion, the second intermediate portion adjoining the second connection portion, and the transmission line portion adjoining the first intermediate portion and the second intermediate portion;

a first ground conductor layer disposed in the multilayer body at a position closer to the negative side of Z-axis than the connection conductor layer and the signal conductor layer, the first ground conductor layer overlapping the connection conductor layer at least partially and also overlapping the signal conductor layer at least partially as viewed in the Z-axis direction;

a first inter-layer connection conductor being in contact with the first connection portion; and a second inter-layer connection conductor being in contact with the second connection portion, wherein one of the first inter-layer connection conductor and the second inter-layer connection conductor pierces through the intermediate insulator layer in the Z-axis direction and electrically connects the connection conductor layer and the radiation conductor layer to each other, the other one of the first inter-layer connection conductor and the second inter-layer connection conductor pierces through the negative-side adjoining insulator layer in the Z-axis direction and electrically connects the connection conductor layer and the signal conductor layer to each other, a longitudinal direction of the connection conductor layer is defined as a direction in which the connection conductor layer is elongated, and a line width direction of the connection conductor layer is defined as a direction orthogonally intersecting both the longitudinal direction and the Z-axis direction, the first connection portion is positioned at a first end portion of the connection conductor layer in the longitudinal direction, and the second connection portion is positioned at a second end portion of the connection conductor layer in the longitudinal direction, the first end portion and the second end portion of the connection conductor layer are positioned opposite to each other in the longitudinal direction, in the longitudinal direction, opposite ends of the first connection portion are positioned equidistantly from a center of the first inter-layer connection conductor as viewed in the Z-axis direction, in the longitudinal direction, opposite ends of the second connection portion are positioned equidistantly from a center of the second inter-layer connection conductor as viewed in the Z-axis direction, in the line width direction, a maximum width of the second connection portion is smaller than a maximum width of the first connection portion, the first intermediate portion includes a first thick-line portion of which a width is greater than that of the transmission line portion in the line width direction, the second intermediate portion includes a second thick-line portion of which a width is greater than that of the transmission line portion in the line width direction, and the first thick-line portion and the second thick-line portion adjoin the transmission line portion.

2. The multilayer substrate according to claim 1, wherein the width of the first thick-line portion is greater than that of the second thick-line portion in the line width direction.

3. The multilayer substrate according to claim 2, wherein the first intermediate portion includes a first thin-line portion of which a width is smaller than the width of the first thick-line portion in the line width direction, the second intermediate portion includes a second thin-line portion of which a width is smaller than the width of the second thick-line portion in the line width direction, the first thin-line portion adjoins the first connection portion, and the second thin-line portion adjoins the second connection portion.

4. The multilayer substrate according to claim 2, wherein the first ground conductor layer overlaps the radiation conductor layer as viewed in the Z-axis direction.

5. The multilayer substrate according to claim 2, wherein the multilayer body includes a first segment and a second segment that are positioned next to each other in an X-axis direction that orthogonally intersects the Z-axis direction, in the Z-axis direction, a thickness of the first segment is greater than a thickness of the second segment, the connection conductor layer is positioned in the first segment, and the signal conductor layer is positioned in the first segment and the second segment.

6. The multilayer substrate according to claim 2, wherein the multilayer body includes a first segment, a second segment, and a third segment that are positioned next to each other in this order in an X-axis direction that orthogonally intersects the Z-axis direction, in the Z-axis direction, a thickness of the first segment is greater than that of the second segment, in the Z-axis direction, a thickness of the third segment is greater than that of the second segment, the multilayer substrate further comprises a second ground conductor layer positioned in the third segment and not positioned in the first segment nor in the second segment, the first ground conductor layer is positioned in the first segment, the second segment, and the third segment, the second ground conductor layer is positioned closer to the positive side of Z-axis than the signal conductor layer and overlaps the signal conductor layer at least partially as viewed in the Z-axis direction, the signal conductor layer forms a microstrip line structure together with the first ground conductor layer in the first segment and the second segment, and the signal conductor layer forms a strip line structure together with the first ground conductor layer and the second ground conductor layer in the third segment.

7. The multilayer substrate according to claim 2, wherein the multilayer body includes a first multilayer portion and a second multilayer portion, the first multilayer portion includes the intermediate insulator layer and at least one insulator layer that is positioned closer to the positive side of Z-axis than the intermediate insulator layer, the second multilayer portion includes at least one insulator layer that is positioned closer to the negative side of Z-axis than the intermediate insulator layer, and a main insulating material of the second multilayer portion is different from a main insulating material of the first multilayer portion.

8. The multilayer substrate according to claim 7, wherein the main insulating material of the second multilayer portion has a Young's modulus smaller than that of the main insulating material of the first multilayer portion.

9. The multilayer substrate according to claim 2, wherein the multilayer body has flexibility, and a material of the multiple insulator layers is a thermoplastic resin.

10. The multilayer substrate according to claim 1, wherein the first intermediate portion includes a first thin-line portion of which a width is smaller than the width of the first thick-line portion in the line width direction, the second intermediate portion includes a second thin-line portion of which a width is smaller than the width of the second thick-line portion in the line width direction, the first thin-line portion adjoins the first connection portion, and the second thin-line portion adjoins the second connection portion.

11. The multilayer substrate according to claim 10, wherein in the line width direction, the width of the first thin-line portion and the width of the second thin-line portion are smaller than the width of the transmission line portion.

12. The multilayer substrate according to claim 1, wherein the first ground conductor layer overlaps the radiation conductor layer as viewed in the Z-axis direction.

13. The multilayer substrate according to claim 1, wherein the multilayer body includes a first segment and a second segment that are positioned next to each other in an X-axis direction that orthogonally intersects the Z-axis direction, in the Z-axis direction, a thickness of the first segment is greater than a thickness of the second segment, the connection conductor layer is positioned in the first segment, and the signal conductor layer is positioned in the first segment and the second segment.

14. The multilayer substrate according to claim 1, wherein the multilayer body includes a first segment, a second segment, and a third segment that are positioned next to each other in this order in an X-axis direction that orthogonally intersects the Z-axis direction, in the Z-axis direction, a thickness of the first segment is greater than that of the second segment, in the Z-axis direction, a thickness of the third segment is greater than that of the second segment, the multilayer substrate further comprises a second ground conductor layer positioned in the third segment and not positioned in the first segment nor in the second segment, the first ground conductor layer is positioned in the first segment, the second segment, and the third segment, the second ground conductor layer is positioned closer to the positive side of Z-axis than the signal conductor layer and overlaps the signal conductor layer at least partially as viewed in the Z-axis direction, the signal conductor layer forms a microstrip line structure together with the first ground conductor layer in the first segment and the second segment, and the signal conductor layer forms a strip line structure together with the first ground conductor layer and the second ground conductor layer in the third segment.

15. The multilayer substrate according to claim 1, wherein the multilayer body includes a first multilayer portion and a second multilayer portion, the first multilayer portion includes the intermediate insulator layer and at least one insulator layer that is positioned closer to the positive side of Z-axis than the intermediate insulator layer, the second multilayer portion includes at least one insulator layer that is positioned closer to the negative side of Z-axis than the intermediate insulator layer, and a main insulating material of the second multilayer portion is different from a main insulating material of the first multilayer portion.

16. The multilayer substrate according to claim 15, wherein the main insulating material of the second multilayer portion has a Young's modulus smaller than that of the main insulating material of the first multilayer portion.

17. The multilayer substrate according to claim 15, wherein a material of the second inter-layer connection conductor is different from that of the first inter-layer connection conductor.

18. The multilayer substrate according to claim 15, wherein a material of the second inter-layer connection conductor is different from that of the first inter-layer connection conductor.

19. The multilayer substrate according to claim 1, wherein the multilayer body has flexibility.

20. The multilayer substrate according to claim 1, wherein a material of the multiple insulator layers is a thermoplastic resin.

* * * * *